United States Patent [19]

Bayer et al.

[11] Patent Number: 5,366,573
[45] Date of Patent: Nov. 22, 1994

[54] UV-CURABLE ADHESIVE SEMICONDUCTOR CHIP MOUNTING PROCESS

[75] Inventors: Heiner Bayer, Olching; Barbara Lehner, Munich; Oskar Wirbser; Gregor Unger, both of Germering, all of Germany

[73] Assignee: Siemens Nixdorf Informationssysteme AG, Paderborn, Germany

[21] Appl. No.: 111,023

[22] PCT Filed: Apr. 17, 1990

[86] PCT No.: PCT/DE90/00290

§ 371 Date: Feb. 21, 1992

§ 102(e) Date: Feb. 21, 1992

[87] PCT Pub. No.: WO91/01043

PCT Pub. Date: Jan. 24, 1991

Related U.S. Application Data

[63] Continuation of Ser. No. 809,482, Feb. 21, 1992, abandoned.

[30] Foreign Application Priority Data

Jul. 12, 1989 [DE] Germany ............... 3923023

[51] Int. Cl.$^5$ .............. B32B 31/00; B23K 1/00
[52] U.S. Cl. ............... 156/64; 156/236; 156/275.5; 156/273.3; 156/273.9; 156/275.7; 156/305; 156/332; 228/103; 228/105
[58] Field of Search ............ 522/24, 60, 6, 7; 156/236, 64, 155, 230, 236, 272.2, 273.3, 275.5, 275.7, 299, 300, 305, 327, 344, 332, 334; 228/103, 104, 105

[56] References Cited

U.S. PATENT DOCUMENTS

| 4,197,132 | 4/1980 | Yazawa et al. | 430/263 |
| 4,219,377 | 8/1980 | Albrecht | 156/330 |
| 4,243,500 | 1/1981 | Glennon | 524/272 X |
| 4,793,883 | 12/1988 | Sheyon et al. | 156/249 X |
| 4,880,486 | 11/1989 | Maeda | 156/275.5 X |
| 4,916,184 | 4/1990 | Clark | 523/176 X |
| 5,110,388 | 5/1992 | Komiyama et al. | 156/275.5 X |
| 5,177,134 | 1/1993 | Mullen, III | 524/284 |

FOREIGN PATENT DOCUMENTS

| 0110285A3 | 6/1984 | European Pat. Off. . |
| 0142783A3 | 5/1985 | European Pat. Off. . |
| 0150882A1 | 8/1985 | European Pat. Off. . |
| 0191534A1 | 8/1986 | European Pat. Off. . |
| 0253444A2 | 1/1988 | European Pat. Off. . |
| 3808667A1 | 10/1989 | Germany . |
| WO89/08896 | 9/1989 | WIPO . |

OTHER PUBLICATIONS

R. W. Nufer, Chip Testing and Sorting, May 1971, IBM Technical Disclosure Bulletin, vol. 13, No. 12, p. 3652.

Primary Examiner—Chester T. Barry
Attorney, Agent, or Firm—Hill, Steadman & Simpson

[57] ABSTRACT

Assembly of semiconductor chips is accomplished using an acrylate-based adhesive which can be cured rapidly by UV light and which gives an adhesive bond that is resistant to soldering by can be readily removed by solvents after soldering. During assembly, the back sides of the semiconductor chips are bonded to a temporary carrier by the adhesive and adjusted to the proper mirror image position on the carrier before the adhesive is cured. The chip array is then soldered on a component and the temporary carrier is removed from the chips by a solvent.

6 Claims, 1 Drawing Sheet

UV-CURABLE ADHESIVE SEMICONDUCTOR CHIP MOUNTING PROCESS

This is a continuation of application Ser. No. 07/809,482, filed Feb. 21, 1992, now abandoned.

BACKGROUND OF THE INVENTION

1. Field of the Invention

The invention relates to a UV-curable adhesive composition for a semiconductor chip mounting process and also to said mounting process.

2. Description of the Related Art

In the course of the development of semiconductor devices, the performance of said devices is being increased by progressive miniaturization of the devices together with the structures contained thereon. If technical reasons require a certain spatial size for a device which exceeds that of an individual device, a large device is often assembled in modular construction from smaller units. Depending on the complexity of the circuits or the size of the structures contained thereon, a spatially precise relative arrangement of the individual modules with respect to one another or to the substrate or carrier may be necessary in assembling the individual modules, which may be similar or even different. The maximum permissible error tolerances may in that case be in the region of a few $\mu$m and are often even less.

WO 89/08896, for example, describes a nonmechanical printer functioning on the electrophotographic principle. Its character generator contains a multiplicity of light sources which are arranged in an exposure line. These are normally light-emitting diodes (LEDs) which are, for example, integrated in two rows of 64 LEDs each on a monolithic chip. The chips are in turn assembled on individual modules from which the exposure line can in turn be assembled in accordance with the paper format to be printed. The achievable printing quality depends on the fineness of the screen, that is to say on the spacing of the individual LEDs on the chip. High-resolution character generators currently achieve a print screen of 600 dots per inch (dpi). With an exposure line 450 mm wide, this corresponds, for example, to a quantity of over 10,000 individual LEDs which are adjacently arranged in two rows with gap offset. In order not to adversely affect the printing quality at this printing density, it is necessary to maintain an error tolerance of $\pm 2$ $\mu$m when assembling the individual chips on a module. For this purpose, the individual chips have to be precisely aligned during mounting on the module before the final fixing. After the alignment, the position of the chips must no longer change during the fixing. For the soldering process normally used for this purpose, this requires, however, extensive precautions since, as is known, the solder fuses during soldering but sliding of the chips, in particular, should be avoided.

Although chips can be fixed with positional accuracy by gluing, a high heat loss has to be dissipated during operation because of the high power density of the integrated chips, and this is only possible via a solder joint.

German Published Application 38 08 667 proposes gluing the chips onto a temporary carrier in an arrangement which is mirror-inverted with respect to the finished module, the precise alignment already being carried out. In this fixed form, the chips are then soldered onto the actual module. After completion of the soldering process, the adhesive bond is released and the temporary carrier consequently removed. However, it has hitherto not been possible to find for this process a suitable adhesive which both makes possible a rapid fixing of the chips on the temporary carrier, the fixing being resistant in the soldering process, and can also be removed again completely after the soldering process.

From IBM Technical Disclosure Bulletin 13, (1971), page 3652, it is known to glue a semiconductor wafer to a temporary carrier with the aid of a photoresist, to divide the wafer into individual chips, to fix the bonding of serviceable chips by means of UV light and, finally, to release the fixed bonds again with the aid of a solvent.

EP-0 142 783 discloses a process for mounting semiconductor devices on a substrate, in which the devices are first glued to the substrate with the aid of a thermally curable adhesive containing styrene polymers. After thermal curing, the devices are soldered on and, finally, the adhesive is removed again with the aid of a solvent.

SUMMARY OF THE INVENTION

It is therefore the object of the present invention to provide an adhesive which can be cured with UV light and which makes possible a rapid and reliable fixing of the chips, for example, on the temporary carrier, which is resistant to the soldering process and which can subsequently be removed without leaving a residue.

This object is achieved by a UV-curable adhesive composition which contains, according to the invention, A) at least one monofunctional (meth)acrylate of an aliphatic or cycloaliphatic alcohol containing 6–20 carbon atoms, B) a polyfunctional reactive crosslinking agent based on a low-molecular-weight aliphatic polyhydric alcohol esterified with (meth)acrylic acid, C) oligomers or polymers containing olefinically unsaturated groups, which can be copolymerized with acrylates and have a slight crosslinking action, for the purpose of flexibilization, D) a photoinitiator system for UV light, and also E) a thermally activable radical starter, from which adhesive composition an adhesive bond can be produced which is resistant to a soldering process and which can also be dissolved with a solvent after the soldering process to leave no residue.

Further developments of the invention and also a process for mounting semiconductor chips on a device are provided by the present invention, wherein the adhesive composition contains further standard additives such as coinitiators, stabilizers or pigments. More specifically, the adhesive composition provides that the component A is present in a proportion of 30 to 70 percent by weight. In addition, the component C is preferably a butadiene/acrylonitrile copolymer containing vinyl terminal groups present in a proportion of 10 to 50 percent by weight. A peroxide is present as the radical starter. Preferably, a suitable amine is present which eliminates the oxygen inhibition during the UV curing of the adhesive composition. The adhesive composition contains a photoinitiator system which is predominantly sensitive to light below 400 nm.

A process for mounting semiconductor chips on a device with the aid of an adhesive composition as disclosed above, comprises the following process steps:

application of a UV-curable adhesive layer to the regions of a temporary carrier provided as adhesion sites, placing of the semiconductor chips to be mounted over the adhesion sites on the temporary carrier with the active side opposite the later soldering site in a mirror-inverted arrangement (with respect to the later mounting on the device), determining the precise positions of the semiconductor chips on the temporary carrier relative to a specified position and, if necessary, aligning the semiconductor chips in accordance with said specified positions, fixing the positions of the semiconductor chips by irradiating the adhesive layer with UV light, curing the adhesive layer at elevated temperature, soldering the rear side of the semiconductor chips glued to the temporary carrier to the device (5) in a soldering process, and releasing the adhesive bond between the semiconductor chips and the temporary carrier and dissolving all the adhesive residues on the semiconductor chips by means of a solvent.

The process preferably further includes the relative positions of the semiconductor chips on the carrier being determined by means of optical measuring methods, in particular by means of a microscope, and the shorter-wave components being filtered out of the light used for this purpose by means of a color filter. The light used to fix the adhesive bond is preferably presented by means of an optical waveguide. Vapor-phase soldering is carried out as the soldering process. A photoresist stripper is preferably used as the solvent.

The adhesive composition according to the invention is a material which cures rapidly when exposed to UV irradiation. This is advantageous, in particular, when a multiplicity of semiconductor devices are to be mounted on a carrier or module, the devices advantageously being individually aligned and immediately fixed. The time necessary to fix all the semiconductor devices on the carrier or module is then the product of the curing time for an adhesive bond and the number of the devices to be mounted on the module. The curing time of the adhesive compositions according to the invention which is in the region of seconds is therefore particularly advantageous since it requires only short machine utilization times and makes possible economical mounting.

The adhesive bonds already immovably fixed by the UV curing are completely cured in a thermal process. This is brought about by the thermally activable radical starters contained in the adhesive composition. A multiplicity of compounds suitable for this purposes makes it possible to adjust the curing to a desired temperature by means of a choice which depends, for example, on the decomposition temperature of the radical starters.

The composition according to the invention is a balanced mixture of monofunctional and polyfunctional constituents which result in a resin matrix which is also sufficiently structurally stable thermally but at the same time contains polymers which are crosslinked to a sufficiently small extent to ensure a problem-free dissolving of the cured adhesive compositions in organic solvents. A completely new property profile of the adhesive composition, which combines objectives, contradictory per se, in an unexpected and nevertheless advantageous manner, is thus achieved.

For the UV sensitivity, a photoinitiator system is provided which yields further advantages compared with a single photoinitiator which is also possible in principle. This is, in particular, a higher sensitivity in relation to the intensity and the wavelength range covered of the light used for curing. In this connection, the sensitivity of the photoinitiator system and, consequently, of the entire adhesive composition is so dimensioned that the latter can be processed with artificial illumination without an undesirable premature curing and the increase in the viscosity of the adhesive composition associated therewith being brought about at the same time. In addition, the precise position of the semiconductor devices on the module is determined before fixing in the normal way with optical methods which, if the longwave characteristic of the radiation used for the measurement is appropriate, also does not bring about premature curing of the adhesive composition. Incidentally, the latter can be stamped in layer thicknesses of, for example, 5 $\mu$m and exhibits good adhesion to glass, metal and chip surfaces which are the carrier materials or surfaces preferably used for an LED line in the specified mounting process.

The optional addition of a pigment dyestuff to the normally colorless adhesive composition makes possible a visual check of the adhesive applied or its removal by solvents.

Coinitiators are capable of accelerating the curing, for example by eliminating oxygen inhibition during the curing process. Generally, the presence of oxygen in a light-cured mixture brings about a decrease in the reaction rate which can even result in inhibition, particularly in the regions near the surface. The oxygen inhibition can be reduced by suitable additives such as are also contained in the adhesive composition according to the invention, so that it is possible to process the adhesive composition even in a normal atmosphere. This can therefore be done by a machine or by hand.

The low-molecular-weight and monofunctional acrylates or methacrylates selected are preferably those of aliphatic or cycloaliphatic alcohols containing 6 to 20 carbon atoms. They are present in the composition in a proportion of 30 to 70 percent by weight. The monofunctional compounds are the more readily soluble components of an adhesive bond composed of the cured adhesive composition. As homopolymers, they form linear and uncrosslinked polymers and are therefore readily soluble. In the adhesive composition, they form the main constituent and their properties therefore also predominantly determine the properties of the adhesive composition or of a cured adhesive bond. Acrylates of aliphatic bicyclic alcohols have rigid molecular structures, cure with low shrinkage and, as homopolymers, have a high second order transition temperature which, with an increasing proportion in the adhesive composition, can also be transmitted to the latter. Further monofunctional acrylates can be derived from linear aliphatic alcohols. Their relatively long and readily mobile aliphatic radicals make them a component which reduces the viscosity of an adhesive bond. As homopolymers, they yield gel-like to rubber-like polymers with good solubility and low second order transition temperature. As monomers, they are low viscosity and dilute the adhesive composition so that a viscosity of the adhesive composition suitable for the processing can be established by means of their proportion. To use the adhesive composition in the stamp application technique a viscosity of, for example, approximately 600 mPas or less is suitable.

As a so-called crosslinking intensifier, the adhesive composition contains a polyfunctional acrylate, preferably a low-molecular-weight aliphatic polyhydric alcohol esterified with acrylic acid or methacrylic acid. During the curing process, it ensures a crosslinking of the adhesive composition and, in this process, increases the mechanical hardness and strength, the solubility of the cured adhesive composition being reduced at the same time. Advantageously, it has three or more functional groups and can therefore be derived, for example, from pentaerythritol, trimethylolpropane or similar compounds. The proportion of the crosslinking intensifier in the adhesive composition is critical in relation to the properties of the cured adhesive bond and, depending on the polymer system used, is between 3 and 15 percent by weight.

As component C) the adhesive composition according to the invention contains an oligomer or polymer which is essentially linear and contains a plurality of functional groups. It serves to elasticize the cured adhesive bond and contains a plurality of polymerizable, olefinically unsaturated groups, for example vinyl or acrylic groups. It has a slight crosslinking action, one crosslinkable group being contained in the polymer (component C) for approximately 1000 molecular weight units. Readily compatible with the other components specified is, for example, a copolymer of butadiene/acrylonitrile having vinyl terminal groups, which may be present in the adhesive composition in a proportion of 10 to 50 percent by weight. Further mechanical properties, such as, for example, tensile strength and elasticity, are established by means of this component. The releasability of the cured adhesive bond is also favorably affected by the component C.

The photoinitiator system (component D) is so selected that the sensitivity maximum is between 300 and 400 nm, providing a sufficiently long stability towards light of longer wavelength. That is to say, with daylight or room illumination, a sufficiently long processing time is possible in which the viscosity does not rise too sharply, so that adhesive application, alignment and fixing of the semiconductor chips can be carried out without difficulty. The selection of the photoinitiator system is otherwise without further limitations, the suitable systems being known in adequate number. The amount added depends on the desired curing rate or on the handling time required before curing.

Suitable tertiary amines are present for eliminating the oxygen inhibition.

The selection of the radical starter is also problem-free since, because of its low proportion in the adhesive composition, it hardly affects, or does not affect at all, the other properties of the latter. Well suited are, for example, a number of peroxides, it being possible to use, for example, the desired decomposition temperature or an adequate storage stability at room temperature and as low a curing temperature as possible as selection criterion.

The adhesive according to the invention can be used, in particular, for a process for mounting semiconductor chips on a device, which process comprises, according to the invention, the following process steps:
  application of a UV-curable adhesive layer to the regions of a temporary carrier provided as adhesion sites,
  placing of the semiconductor chips to be mounted over the adhesion sites on the temporary carrier with the active side opposite the later soldering site in a mirror-inverted arrangement (with respect to the later mounting on the device),
  determining the precise positions of the semiconductor chips on the temporary carrier relative to a specified position and, if necessary, aligning the semiconductor chips in accordance with said specified positions,
  fixing the positions of the semiconductor chips by irradiating the adhesive layer with UV light,
  curing the adhesive layer at elevated temperature,
  soldering the rear side of the semiconductor chips glued to the temporary carrier to the device in a soldering process, and
  releasing the adhesive bond between the semiconductor chips and the temporary carrier and dissolving all the adhesive residues on the semiconductor chips by means of a solvent.

In the process, which is also according to the invention, the hitherto unknown properties of the adhesive composition according to the invention are exploited in an advantageous manner. This is a so-called resoldering process in which a plurality of semiconductor chips are first glued to a temporary carrier in the desired, but mirror-inverted arrangement. Since the adhesive is UV-curing, the adhesive bonds of the chips to the temporary carrier can be examined and readjusted with respect to a specified value before this position is fixed by means of irradiation. The adhesive cures in the UV light within a few seconds so that it is possible to place every chip individually, align it and fix it. The already mechanically fixed adhesive bond is exposed for a short time to an elevated temperature, in which process a complete curing of the adhesive layer takes place. The precise alignment or position of the semiconductor chips on the temporary carrier remains intact in this process.

In a soldering process, the semiconductor chips fixed on the temporary carrier are now soldered to the final carrier, for example a device. Depending on the soldering process used, the cured adhesive layer is exposed under these conditions to a temperature of up to approximately 215° C. Here again the precise alignment of the chips on the temporary carrier remains intact, so that it is also achieved on the device when the solder hardens.

After the solder has cooled, the chips are fixed on the device, so that the temporary carrier can now be removed. The adhesive layer is dissolved with, in particular, organic solvents, it being possible to carry out the removal completely and without leaving residues.

The precise position of the semiconductor chip on the temporary carrier can be determined by means of optical methods, in particular by means of a microscope. In this process, the position of the semiconductor chips can be determined relative to one another, or absolutely with respect to the carrier, it being possible for measuring marks to be provided on the carrier in the latter case. Advantageously, the optical measurement is carried out at a wavelength which is outside the sensitivity range of the adhesive composition or its photoinitiator. If the sensitivity range is, as specified, between 300 and 400 nm, a color filter, for example a yellow filter, can be provided for the microscope light in order to filter out components of the microscope light of shorter wavelength.

To fix the adhesive bond, any desired UV-light source whose light can be presented to the adhesive bond, for example, via an optical waveguide is adequate. Thus, it is possible to fix individual adhesion sites without at the same time curing the adhesive already applied for the semiconductor chips to be fixed later.

To finally mount the semiconductor chips fixed on the temporary carrier on the device, a vapor-phase soldering (vapor-phase process) may, for example, be carried out. For this purpose, a solder paste is applied, for example by stamping or screen printing, to the planned soldering site on the device. The semiconductor chips are now fixed with the temporary carrier above the soldering site. The heat necessary for the soldering process is supplied by means of inert organic vapors. In this process, the entire arrangement is exposed to temperatures of up to approximately 215° C. for several minutes. The adhesive bond of the semiconductor chips to the temporary carrier withstands both the organic vapors and the elevated temperature without damage.

After cooling the solder, the adhesive bond is treated with an organic solvent and completely dissolved thereby. The treatment with the solvent can be carried out by spraying, rinsing or immersion. For this purpose, strongly polar solvents or mixtures of a plurality of solvents are suitable. Advantageously, a basic photoresist stripper can also be used. In this process, and also throughout the rest of the process, no corrosion of the semiconductor components or of the metallic terminal points (bonding pads), which are composed, for example, of aluminum, is observed.

In the case of less effective solvents, the removal of the adhesive layer can be carried out in a bath and assisted by raising the temperature or mechanically or with ultrasound.

BRIEF DESCRIPTION OF THE DRAWINGS

The invention is explained in greater detail below by an exemplary embodiment and four figures associated therewith. In this connection, the figures show different process stages in the mounting of semiconductor chips on a device using a temporary carrier.

DETAILED DESCRIPTION OF THE PREFERRED EMBODIMENTS

Exemplary Embodiment

A selected adhesive composition contains, for example, the following components, the amounts being specified in parts by mass (PM) and the trade name and manufacturer being specified in brackets.

| | |
|---|---|
| 10.0 PM | Octyldecyl acrylate (ODA, Interez) |
| 60.0 PM | Isobornyl acrylate (IBA, Alcolac) |
| 10.0 PM | Ethoxylated trimethylolpropane triacrylate (TMPEOTA, Interez) |
| 40.0 PM | Vinyl-terminated butadiene-acrylonitrile-butadiene copolymer (Hycar 1300 X23, Hycar) |
| 6.0 PM | 2-(Dimethylamino)ethyl benzoate (DMB, Shell) |
| 2.0 PM | 2-Methyl-1-(4-(methylthio)phenyl)-2-morpholino-1-propanone (Irgacure 907, Ciba Geigy) |
| 2.0 PM | Isopropylthioxanthone (ITX, Shell) |
| 2.0 PM | 1,1-Bis(t-butylperoxy)-3,3,5-trimethylcyclohexane (Luperox 231-50, supplied by Luperox) |
| 0.5 PM | Red pigment dispersion (LI-777, Loctite) |

The specified adhesive composition is a readily stampable material which has a viscosity of less than 600 mPas and which wets, for example, surfaces composed of glass or metal well and adheres well thereto even after curing.

Figure 1:
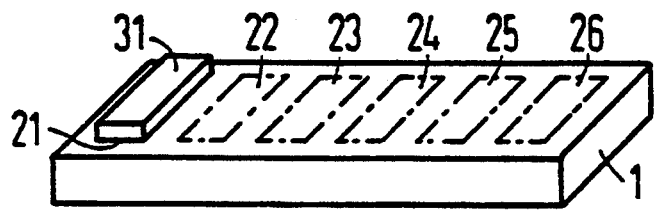

It is now planned to mount a plurality of semiconductor chips in a specified arrangement and with high precision (error tolerance, for example, $\pm 2$ $\mu$m) on a device. For this purpose, the following procedure is adopted:

FIG. 1: an adhesive layer (21 to 26) of the material specified above is applied at each of the specified adhesion sites to a temporary carrier 1 which is composed, for example, of glass or metal. Suitable for this purpose is, for example, a stamping process with which 5 $\mu$m thick layers 21 to 26 are produced. The red-colored but transparent material is readily processable in air and does not exhibit any marked increase in viscosity during the process. A first semiconductor chip 31 is now placed on the adhesive layer 21. The precise position of the semiconductor chip 31 on the temporary carrier 1 is checked by means of a microscope (not shown in the figure) and, if necessary, readjusted. As an aid, markings can be applied for this purpose to the carrier 1 which are detected, in the case of a temporary carrier composed of glass, in transmitted illumination and, in the case of a temporary carrier composed of steel, by other suitable methods. The semiconductor chips are normally placed and aligned in a fully automated manner. After the first semiconductor chip 31 has been aligned on the temporary carrier 1, the adhesive layer 21 is slightly cured by irradiation with UV light and the adhesive bond fixed in this way. For this purpose, the regions of the adhesive layer 21 still accessible in the arrangement (1, 21, 31) can be exposed with the aid of an optical waveguide, the other adhesive layers 22 to 26 present on the temporary carrier 1 not being affected by the exposure and, consequently, not cured either.

Figure 2:
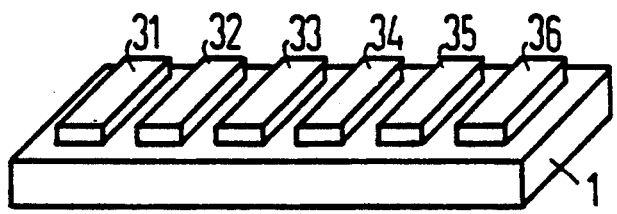

FIG. 2 shows the temporary carrier 1, to which further semiconductor chips 32 to 36 have been successively applied, aligned and fixed in an appropriate manner on the corresponding adhesive layers 22 to 26. The relative position of the semiconductor chips 31 to 36 corresponds to the arrangement mirror-inverted for the mounting on the device since the later upper side of the semiconductor chips 31 to 36 are glued to the temporary carrier. The adhesive layers, which produce the adhesive bonds, are cured to such an extent that the semiconductor chips are immovably fixed. To completely cure the adhesive layers or the adhesive bonds, the arrangement shown in FIG. 2 is brought to an elevated temperature of approximately 120° C. for a short time. The peroxides contained in the adhesive composition decompose in this process to form radicals and initiate the complete crosslinking and curing of the adhesive layer.

A solder paste is now applied, for example by screen printing, to the device in the regions provided for mounting. With the still free surface downwards, the semiconductor chips 31 to 36 mounted on the temporary carrier 1 are placed, at the position provided, above the solder paste and mechanically fixed in a suitable manner. In a vapor-phase soldering system, the arrangement comprising temporary carrier and component, together with semiconductor chips situated in between, is heated to up to 215° C. for a short time, in which process the solder present in the solder paste melts. The adhesive bond of the semiconductor chips 31 to 36 to the temporary carrier 1 withstands both the high temperatures and the vapors of the organic solvent (for example Freon) used for the heat transfer without the semiconductor chips changing their position under the conditions.

Figure 3:
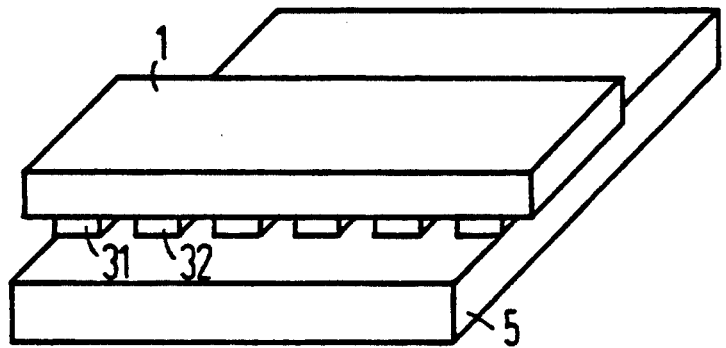

FIG. 3 shows the arrangement in which the semiconductor chips 31 to 36 fixed or glued to the temporary carrier 1 are now securely mounted on the device 5 by means of a solder joint, after the solder has cooled. The adhesive bonds of the semiconductor chips 31 to 36 to the temporary carrier 1 are now released with a suitable solvent or a solvent mixture. For example, the adhesive bond may be sprayed with a photoresist stripper for this purpose. As a result of the adhesive layer swelling, the adhesive bond to the temporary carrier is first released and then, as a consequence of further treatment, all the adhesive residues on the semiconductor chips 31 to 36 are removed.

Figure 4:
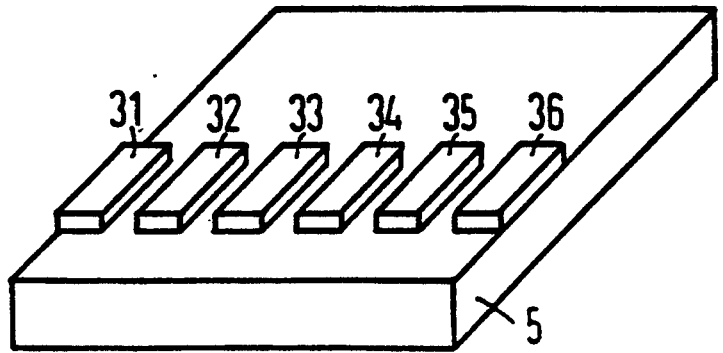

FIG. 4 shows the arrangement after the removal of the temporary carrier and the adhesive residues. At the same time, the process is not limited to a simple arrangement of the semiconductor chips as shown in the figures, but on the contrary complex arrangements, even of different semiconductor chips, can also be mounted on a device. The precision in the arrangement achieved in this process is not possible, or only possible with great effort, by direct soldering. Despite the detour via the auxiliary fixing of the semiconductor chips on the temporary carrier this is nevertheless a rapid process since the fixing of the adhesive bond requires only a few seconds. Placing and alignment of the semiconductor chips on the temporary carrier take place at the usual speed for highly automated processes.

Although other modifications and changes may be suggested by those skilled in the art, it is the intention of the inventors to embody within the patent warranted hereon all changes and modifications as reasonably and properly come within the scope of their contribution to the art.

We claim:

1. A process for mounting semiconductor chips on a device with the aid of an adhesive composition, which comprises the following process steps:

applying a UV-curable adhesive layer to regions of a temporary carrier provided as adhesion sites, placing semiconductor chips to be mounted over the adhesion sites on the temporary carrier with an active side opposite a later soldering site in a mirror-inverted arrangement with respect to a later mounting on the device, determining precise positions of the semiconductor chips on the temporary carrier (1) relative to a specified position and, if necessary, aligning the semiconductor chips in accordance with said precise positions, fixing positions of the semiconductor chips by irradiating the adhesive layer with UV light, curing the adhesive layer at elevated temperature, soldering a rear side of the semiconductor chips glued to the temporary carrier to the device in a soldering process, and releasing an adhesive bond between the semiconductor chips and the temporary carrier and dissolving substantially all adhesive residues on the semiconductor chips by a solvent.

2. A process as claimed in claim 1, wherein said step of determining the precise positions of the semiconductor chips on the carrier includes optical measuring by a microscope, and filtering out shorter-wave components from light used for this purpose by a color filter.

3. A process as claimed in claim 1, wherein light used in said step of fixing is carried by an optical waveguide.

4. A process as claimed in claim 1, wherein said step of soldering comprises vapor-phase soldering.

5. A process as claimed in claim 1, wherein said solvent used in said step of releasing comprises a photoresist stripper.

6. A process as claimed in claim 1, wherein said UV-curable adhesive layer is of an adhesive composition comprising:

A) at least one monofunctional (meth)acrylate of an aliphatic or cycloaliphatic alcohol containing 6–20 carbon atoms, B) a polyfunctional reactive crosslinking agent based on a low-molecular-weight aliphatic polyhydric alcohol esterified with (meth)acrylic acid, C) oligomers or polymers containing olefinically unsaturated groups, which can be copolymerized with acrylates and have a slight crosslinking action, for the purpose of flexibilization, D) a photoinitiator system for UV light, and E) a thermally activatable radical starter, from which adhesive composition an adhesive bond can be produced which is resistant to a soldering process and which can also be dissolved with a solvent after the soldering process to leave no residue.

* * * * *